United States Patent
Lee

(10) Patent No.: US 10,885,992 B2
(45) Date of Patent: Jan. 5, 2021

(54) MEMORY SYSTEM AND OPERATING METHOD THEREOF

(71) Applicant: SK hynix Inc., Gyeonggi-do (KR)

(72) Inventor: Joo-Young Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/597,251

(22) Filed: Oct. 9, 2019

(65) Prior Publication Data

US 2020/0211665 A1 Jul. 2, 2020

(30) Foreign Application Priority Data

Dec. 26, 2018 (KR) .......................... 10-2018-0169486

(51) Int. Cl.
*G11C 16/04* (2006.01)
*G11C 16/34* (2006.01)
*G11C 29/00* (2006.01)
*G11C 16/16* (2006.01)

(52) U.S. Cl.
CPC .......... *G11C 16/3431* (2013.01); *G11C 16/16* (2013.01); *G11C 16/349* (2013.01); *G11C 29/886* (2013.01)

(58) Field of Classification Search
CPC ... G11C 16/3431; G11C 16/16; G11C 16/349; G11C 29/886
USPC .................................................... 365/185.09
See application file for complete search history.

(56) References Cited

U.S. PATENT DOCUMENTS

| 7,487,424 | B2 * | 2/2009 | Nam | .................. H04L 1/1621 714/748 |
| 2006/0059326 | A1 * | 3/2006 | Aasheim | ............ G06F 12/0246 711/203 |
| 2010/0329011 | A1 * | 12/2010 | Lee | ....................... G11C 16/04 365/185.17 |

FOREIGN PATENT DOCUMENTS

KR 10-2018-0026876 3/2018
KR 10-2019-0110243 9/2019

* cited by examiner

*Primary Examiner* — Vu A Le
(74) *Attorney, Agent, or Firm* — IP & T Group LLP

(57) ABSTRACT

A memory system includes: a memory device; a run-time bad block detector suitable for storing information of super memory blocks, each including a run-time bad block, in a bad list; a bit-map manager suitable for generating a bit-map representing integrity information of memory blocks in each of the super memory blocks; a short super block manager suitable for designating, among the super memory blocks, a super memory block having a number of run-time bad blocks less than or equal to a threshold as a short super memory block based on the bad list and the bit-map, whenever a logical unit configuration command is received from a host; and a processor suitable for controlling the memory device to simultaneously access normal blocks among the memory blocks forming the designated short super memory block and to perform a normal operation, based on the bit-map.

20 Claims, 16 Drawing Sheets

|     | PLANE 11 | PLANE 21 | PLANE 12 | PLANE 22 | PLANE 13 | PLANE 23 | 402 |
|-----|----------|----------|----------|----------|----------|----------|-----|
| SB1 | BLK 111  | BLK 221  | BLK 112  | BLK 122  | BLK 113  | BLK 123  |     |
| SB2 | BLK 211  | BLK 321  | BLK 312  | BLK 222  | BLK 213  | BLK 223  |     |
| SB3 | BLK 311  | BLK 121  | BLK 212  | BLK 322  | BLK 313  | BLK 323  |     |
| SB4 | BLK 411  | BLK 421  | BLK 412  | BLK 422  | BLK 413  | BLK 423  |     |

NORMAL_BLK

RTBB

FIG. 8

| | PLANE 11 | PLANE 21 | PLANE 12 | PLANE 22 | PLANE 13 | PLANE 23 |
|---|---|---|---|---|---|---|
| SB1 | 1 | 0 | 1 | 1 | 1 | 1 |
| SB2 | 1 | 1 | 0 | 1 | 1 | 1 |
| SB3 | 0 | 1 | 1 | 1 | 0 | 0 |
| SB4 | 1 | 1 | 1 | 1 | 1 | 1 |

802

MEMORY SYSTEM AND OPERATING METHOD THEREOF

CROSS-REFERENCE TO RELATED APPLICATION

The present application claims priority of Korean Patent Application No. 10-2018-0169486, filed on Dec. 26, 2018, which is incorporated herein by reference in its entirety.

BACKGROUND

1. Field

Various embodiments of the present invention relate to a memory system, and more particularly, to a memory system for efficiently forming a super block, and a method for operating the memory system.

2. Description of the Related Art

The computer environment paradigm has shifted to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Memory systems provide excellent stability, durability, high information access speed, and low power consumption since they have no moving parts, as compared with a hard disk device. Examples of memory systems having such advantages include universal serial bus (USB) memory devices, memory cards having various interfaces, and solid state drives (SSDs).

SUMMARY

Embodiments of the present invention are directed to a memory system capable of forming a short super block including a run-time bad block and access normal blocks in the short super block based on a bit-map representing information about normal blocks and bad blocks.

In accordance with an embodiment of the present invention, a memory system includes: a memory device; a run-time bad block detector suitable for storing information of super memory blocks, each including a run-time bad block, in a bad list; a bit-map manager suitable for generating a bit-map representing integrity information of memory blocks in each of the super memory blocks; a short super block manager suitable for designating, among the super memory blocks, a super memory block having a number of run-time bad blocks less than or equal to a threshold as a short super memory block based on the bad list and the bit-map, whenever a logical unit configuration command is received from a host; and a processor suitable for controlling the memory device to simultaneously access normal blocks among the memory blocks forming the designated short super memory block and to perform a normal operation, based on the bit-map.

In accordance with another embodiment of the present invention, a method for operating a memory system includes: storing information of super memory blocks, each including a run-time bad block, in a bad list; generating a bit-map representing integrity information of memory blocks in each of the super memory blocks; designating, among the super memory blocks, a super memory block having a number of run-time bad blocks less than or equal to a threshold as a short super memory block based on the bad list and the bit-map, whenever a logical unit configuration command is received from a host; and simultaneously accessing normal blocks among the memory blocks forming the designated short super memory block and performing a normal operation based on the bit-map.

In accordance with another embodiment of the present invention, a memory system includes: a memory device including a plurality of super memory blocks; and a controller suitable for: detecting bad super memory blocks each including at least one bad block, among the plurality of super memory blocks; determining a short super memory block among the bad super memory blocks, the short super memory block having a number of bad blocks less than or equal to a threshold; and simultaneously performing a normal operation on normal blocks of the short super memory block.

BRIEF DESCRIPTION OF THE DRAWINGS

FIG. 8 is a diagram illustrating a process of generating a bit-map in accordance with an embodiment of the present invention.

DETAILED DESCRIPTION

Figure 1:
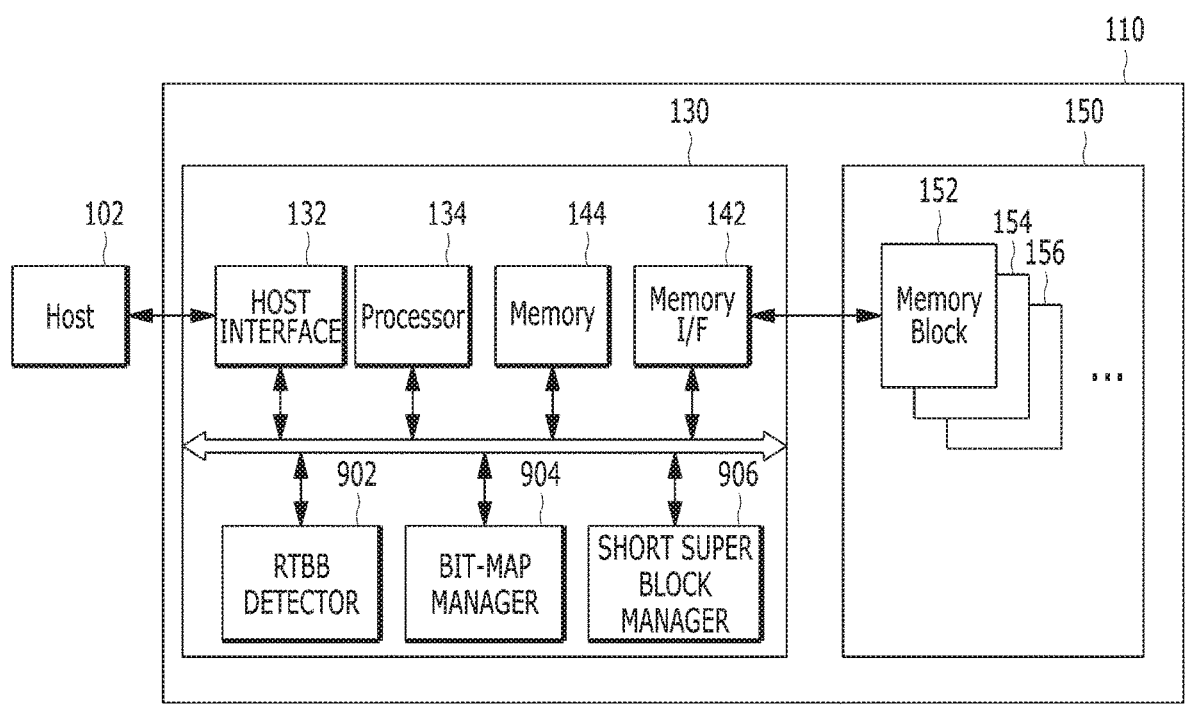
FIG. 1 is a block diagram illustrating a data processing system including a memory system in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete and fully conveys the scope of the present invention to those skilled in the art. Throughout the disclosure, like reference numerals refer to like parts throughout the various figures and embodiments of the present invention.

It is noted that, throughout the specification, reference to "an embodiment," "another embodiment" or the like does not necessarily mean only one embodiment, and different references to any such phrase are not necessarily to the same embodiment(s).

It will be understood that, although the terms "first" and/or "second" may be used herein to identify various elements, these elements should not be limited by these terms. These terms are only used to distinguish one element from another element. For example, a first element in one instance could be termed a second element in another instance, and vice versa, without departing from the teachings of the present disclosure.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms and vice versa, unless the context clearly indicates otherwise. It will be further understood that the open-ended terms, such as "comprise", "include", "have", etc., when used in this specification, specify the presence of stated features, numbers, steps, operations, elements, components, and/or combinations thereof but do not preclude the presence or addition of one or more other features, numbers, steps, operations, elements, components, and/or combinations thereof.

The below-described embodiments are merely for the purpose of understanding the technical spirit of the present disclosure; the scope of the present invention should not be limited to the disclosed embodiments. It will be apparent to those skilled in the art, in light of the present disclosure, that various other embodiments may be made in addition to the disclosed embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed in an ideal or excessively formal way.

Various embodiments of the present invention are described in detail below with reference to the attached drawings.

FIG. 1 is a block diagram illustrating a data processing system 100 including a memory system 110 in accordance with an embodiment of the present invention.

Referring to FIG. 1, the data processing system 100 may include a host 102 operatively coupled to the memory system 110.

The host 102 may include any of a variety of portable electronic devices such as a mobile phone, a MP3 player and a laptop computer, or any of a variety of non-portable electronic devices such as a desktop computer, a game machine, a television (TV) and a projector.

The host 102 may include one operating system (OS) or a plurality of operating systems. The host 102 may execute an OS to perform an operation corresponding to a user's request on the memory system 110. Here, the host 102 may provide a plurality of commands corresponding to a user's request to the memory system 110. Thus, the memory system 110 may perform certain operations corresponding to the plurality of commands, that is, corresponding to the user's request. The OS may manage and control overall functions and operations of the host 102. The OS may support an operation between the host 102 and a user using the data processing system 100 or the memory system 110.

The memory system 110 may operate or perform a specific function or operation in response to a request from the host 102. Particularly, the memory system 110 may store data to be accessed by the host 102. The memory system 110 may be used as a main memory system or an auxiliary memory system of the host 102. The memory system 110 may be implemented with any of various types of storage devices, which may be electrically coupled with the host 102, according to a protocol of a host interface. Non-limiting examples of the memory system 110 include a solid state drive (SSD), a multi-media card (MMC) and an embedded MMC (eMMC).

The memory system 110 may include any of various types of storage devices. Non-limiting examples of such storage devices include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM), and a flash memory.

The memory system 110 may include a controller 130 and a memory device 150.

The controller 130 and the memory device 150 may be integrated into a single semiconductor device, which may be included in any of the various types of memory systems described above. For example, the controller 130 and the memory device 150 may be integrated as a single semiconductor device to constitute a solid state drive (SSD), a personal computer memory card international association (PCMCIA) card, a secure digital (SD) card (e.g., a mini-SD, a micro-SD and an SD High Capacity (SDHC)), or an universal flash storage (UFS) device. The memory system 110 may be configured as a part of a computer, a smart phone, a portable game player, or one of various components configuring a computing system.

The memory device 150 may be a nonvolatile memory device which may retain stored data even though power is not supplied. The memory device 150 may store data provided from the host 102 through a write operation, and output data stored therein to the host 102 through a read operation. In an embodiment, the memory device 150 may include a plurality of memory dies (not shown), and each memory die may include a plurality of planes (not shown). Each plane may include a plurality of memory blocks 152 to 156, each of which may include a plurality of pages, each of which may include a plurality of memory cells coupled to a word line. In an embodiment, the memory device 150 may be a flash memory having a 3-dimensional (3D) stack structure.

The structure of the memory device 150 and the three-dimensional stereoscopic stack structure of the memory device 150 will be described below in more detail with reference to FIGS. 10 to 12.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

More specifically, the controller 130 may include a host interface (I/F) 132, a processor 134, a memory interface 142, and a memory 144, all operatively coupled or engaged via an internal bus. As described below with reference to FIG. 9, the controller 130 may further include a run-time bad block (RTBB) detector 902, a bit-map manager 904, and a short super block manager 906.

The host interface 132 may process a command and data of the host 102. The host interface 132 may communicate with the host 102 through one or more of various Interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE). The host interface 132 may be driven via firmware, that is, a host interface layer (HIL) for exchanging data with the host 102.

The memory interface 142 may serve as a memory/storage interface between the controller 130 and the memory device 150 such that the controller 130 may control the memory device 150 in response to a request from the host 102.

The memory 144 may serve as a working memory of the memory system 110 and the controller 130, and store data for driving the memory system 110 and the controller 130.

The memory 144 may be a volatile memory. For example, the memory 144 may be a static random access memory (SRAM) or dynamic random access memory (DRAM). The memory 144 may be disposed within or external to the controller 130. In an embodiment, as shown in FIG. 1, the memory 144 may be disposed within the controller 130. In another embodiment, the memory 144 may be an external volatile memory having a memory interface for transferring data between the memory 144 and the controller 130.

As described above, the memory 144 may include a program memory, a data memory, a write buffer/cache, a read buffer/cache, a data buffer/cache and a map buffer/cache to store some data required to perform data write and read operations between the host 102 and the memory device 150 and other data required for the controller 130 and the memory device 150 to perform these operations.

The processor 134 may control overall operations of the memory system 110. The processor 134 may use firmware to control the overall operations of the memory system 110. The firmware may be referred to as flash translation layer (FTL). The processor 134 may be implemented with a microprocessor or a central processing unit (CPU).

For example, the controller 130 may perform an operation requested by the host 102 in the memory device 150 through the processor 134. Also, the controller 130 may perform a background operation on the memory device 150 through the processor 134. The background operation may include an operation of copying and processing data stored in some memory blocks among the memory blocks 152 to 156 of the memory device 150 into other memory blocks (i.e., a garbage collection (GC) operation), an operation of swapping data between select blocks of the memory blocks 152 to 156 (i.e., a wear-leveling (WL) operation), an operation of storing the map data stored in the controller 130 in the memory blocks 152 to 156 (i.e., a map flush operation), or an operation of managing bad blocks of the memory device 150 (i.e., a bad block management operation of detecting and processing bad blocks among the memory blocks 152 to 156 in the memory device 150).

Figure 2:
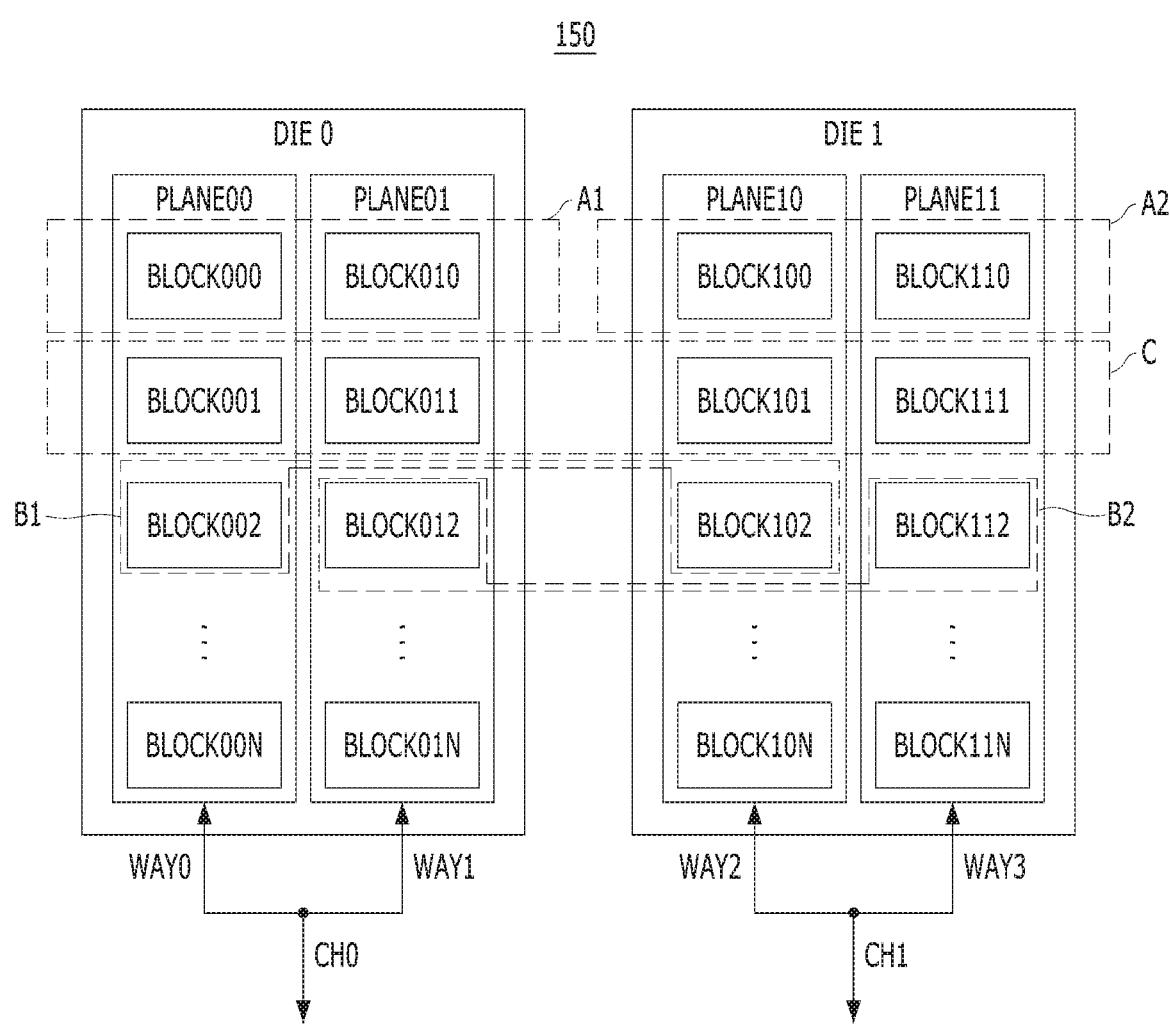
FIG. 2 is a block diagram illustrating a concept of a super memory block used in a memory system in accordance with an embodiment of the present invention.

FIG. 2 is a diagram illustrating a concept of a super memory block used in a memory system in accordance with an embodiment of the present invention.

It is noted that FIG. 2 illustrates in detail certain constituent elements of the memory device 150 relevant to the description pertaining to a super memory block. Other elements of the memory device 150 are omitted for clarity.

Referring to FIG. 2, the memory device 150 may include a plurality of memory blocks, e.g., BLOCK000 to BLOCK00N, BLOCK010 to BLOCK01N, BLOCK100 to BLOCK10N and BLOCK110 to BLOCK11N.

In addition, the memory device 150 may include a first memory die DIE0 capable of inputting and outputting data through a zeroth channel CH0 and a second memory die DIE1 capable of inputting and outputting data through a first channel CH1. The zeroth and first channels CH0 and CH1 may input and output data in an interleaving scheme.

The first memory die DIE0 may include a plurality of planes, e.g., PLANE00 and PLANE01, respectively corresponding to a plurality of ways, e.g., WAY0 and WAY1. The ways WAY0 and WAY1 may input and output data in an interleaving scheme by sharing the zeroth channel CH0.

The second memory die DIE1 may include a plurality of planes, e.g., PLANE 10 and PLANE 11, respectively corresponding to a plurality of ways, e.g., WAY2 and WAY3. The ways WAY2 and WAY3 may input and output data in an interleaving scheme by sharing the first channel CH1.

The first plane PLANE00 of the first memory die DIE0 may include a predetermined number of memory blocks, e.g., BLOCK000 to BLOCK00N, among the plurality of memory blocks in the memory device 150.

The second plane PLANE01 of the first memory die DIE0 may include a predetermined number of memory blocks, e.g., BLOCK010 to BLOCK01N, among the plurality of memory blocks of the memory device 150.

The first plane PLANE10 of the second memory die DIE1 may include a predetermined number of memory blocks, e.g., BLOCK100 to BLOCK10N, among the plurality of memory blocks of the memory device 150.

The second plane PLANE11 of the second memory die DIE1 may include a predetermined number of memory blocks, e.g., BLOCK110 to BLOCK11N, among the plurality of memory blocks of the memory device 150.

In this manner, the plurality of memory blocks in the memory device 150 may be divided into groups, according to their physical locations and their use of the ways and channels.

Although FIG. 2 illustrates an arrangement in which two memory dies are included in the memory device 150, and two planes are included in each of the memory dies, the invention is not limited in this way. Alternatively, more or fewer memory dies than two may be included in the memory device 150, more or fewer planes than two may be included in each of the memory dies, according to system design considerations. Moreover, the number of memory blocks included in each of the planes may be also adjusted according to system design considerations.

Instead of dividing the memory blocks based on their physical locations, alternatively, the controller 130 may divide the plurality of memory blocks BLOCK000 to BLOCK00N, BLOCK010 to BLOCK01N, BLOCK100 to BLOCK10N and BLOCK110 to BLOCK11N on a basis of memory blocks which are simultaneously selected and operated. In other words, the controller 130 may manage a plurality of memory blocks which are located in different dies or different planes, by grouping memory blocks capable of being selected simultaneously, thereby dividing the grouped memory blocks into super memory blocks.

The simultaneous selection scheme of grouping the memory blocks into super memory blocks by the controller 130 may be performed in various ways according to system design considerations. Herein, three simultaneous selection schemes will be exemplified as follows.

A first scheme is to group an arbitrary memory block BLOCK000 from the first plane PLANE00 and an arbitrary memory block BLOCK010 from the second plane PLANE01 of the first memory die DIE0 and manage the grouped memory blocks BLOCK000 and BLOCK010 as a single super memory block A1. When the first scheme is applied to the second memory die DIE1, the controller 130 may group an arbitrary memory block BLOCK100 from the first plane PLANE10 and an arbitrary memory block BLOCK110 from the second plane PLANE11 and manage the grouped memory blocks BLOCK100 and BLOCK110 as a single super memory block A2.

A second scheme is to group an arbitrary memory block BLOCK002 from the first plane PLANE00 of the first memory die DIE0 and an arbitrary memory block BLOCK102 from the first plane PLANE10 of the second memory die DIE1 and manage the grouped memory blocks BLOCK002 and BLOCK102 as a single super memory block B1. In addition, according to the second way, the controller 130 may group an arbitrary memory block BLOCK012 from the second plane PLANE01 of the first memory die DIE0 and an arbitrary memory block BLOCK112 from the second plane PLANE11 of the second memory die DIE1 and manage the grouped memory blocks BLOCK012 and BLOCK112 as a single super memory block B2.

A third scheme is to group an arbitrary memory block BLOCK001 from the first plane PLANE00 of the first memory die DIE0, an arbitrary memory block BLOCK011 from the second plane PLANE01 of the first memory die DIE0, an arbitrary memory block BLOCK101 from the first plane PLANE10 of the second memory die DIE1, and an arbitrary memory block BLOCK111 from the second plane PLANE11 of the second memory die DIE1 and manage the grouped memory blocks BLOCK001, BLOCK011, BLOCK101 and BLOCK111 as a single super memory block C.

The simultaneously-selectable memory blocks in the respective super memory blocks may be simultaneously selected by the controller 130 through an interleaving scheme, for example, a channel interleaving scheme, a memory die interleaving scheme, a memory chip interleaving scheme or a way interleaving scheme.

When the memory device 150 repeatedly performs a program operation and an erase operation, one or more of its memory blocks, originally determined as normal, may later be detected as abnormal in tests performed after manufacturing. A memory block that becomes abnormal as a result of the repeated program operation and erase operation may be defined as a run-time bad block RTBB. As described earlier with reference to FIG. 2, the controller 130 may control the memory device 150 to simultaneously access all the memory blocks in a super memory block and to perform a program operation or an erase operation (any of which may be considered a normal operation) based on a unit of a super memory block. When a run-time bad block RTBB occurs among the memory blocks in the super memory block, the memory device 150 may not perform a normal operation NORMAL_OP based on the unit of a super memory block.

The controller 130 may control the memory device 150 to perform a normal operation NORMAL_OP on the basis of a super memory block only for a super memory block formed of normal blocks only. Accordingly, when a run-time bad block RTBB occurs among the memory blocks in the super memory block, the controller 130 may process a victim super memory block including the run-time bad block RTBB as a bad block and control the memory device 150 not to access the victim super memory block. When the controller 130 processes the victim super memory block including the run-time bad block RTBB as a bad block, the controller 130 may not use the normal blocks, which are the memory blocks other than the run-time bad block RTBB, in the victim super memory block, thus wastefully consuming the memory space.

In order to avoid this wasting memory space, the controller 130 may replace a run-time bad block RTBB in one victim super memory block with a target normal block in another, different victim super memory block. The victim super block may include at least one run-time bad block RTBB. Also, the target normal block may be a normal block in the same relative plane location-wise as a plane to which the run-time bad block RTBB belongs. As described later with reference to FIGS. 3 and 4, the controller 130 may perform a re-mapping operation for mapping the address of the run-time time bad block RTBB to the address of the target normal block, and may separately store the changed address which is obtained as a result of the re-mapping operation in the form of a table.

Figure 3:
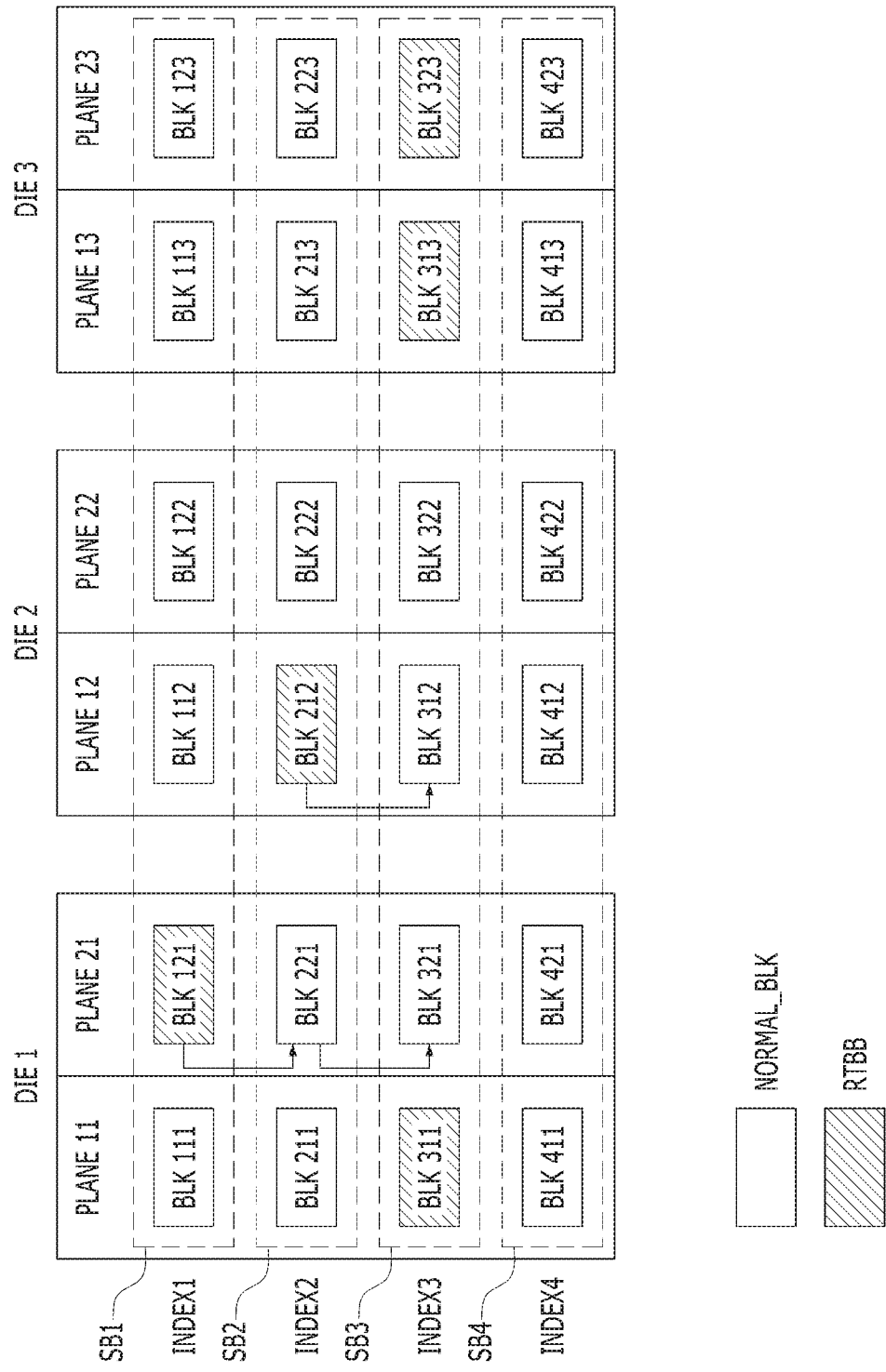
FIG. 3 is a diagram illustrating a re-mapping operation.

FIG. 3 illustrates a re-mapping operation.

A super memory block formed of memory blocks sharing the same index, among the memory blocks in each of two planes in each of the first to third dies DIE1 to DIE3, is described. For example, the controller 130 may form a first super memory block SB1 to include memory blocks that share a first index INDEX1. In this example, such memory blocks include BLK111 of PLANE11, DIE1; BLK121 of PLANE21, DIE1; BLK112 of PLANE12, DIE2; BLK122 of PLANE22, DIE2; BLK113 of PLANE13, DIE3; and BLK123 of PLANE23, DIE3. Similarly, the controller 130 may form second to fourth super memory blocks SB1 to SB4 to include memory blocks that share second to fourth indices INDEX2 to INDEX4 respectively among the memory blocks in the first to third dies DIE1 to DIE3.

FIG. 3 shows a state where run-time bad blocks RTBBs occurs. Referring to FIG. 3, the RTBBs detected by the controller 130 include memory block BLK121 in PLANE21 of the first die DIE1 and in the first super memory block SB1; memory block BLK212 in PLANE12 of the second die DIE2 and in the second super memory block SB2; and memory block BLK311, which is in PLANE11 of the first die DIE1; and memory blocks BLK313 and BLK323, which are respectively included in the first plane PLANE13 and the second plane PLANE23 of the third die DIE3 and in the third super memory block SB3.

The controller 130 may detect a victim super memory block having a normal block to replace the run-time bad block BLK121 in the first super memory block SB1 in order to perform a re-mapping operation. The controller 130 may designate one or more of the remaining super memory blocks (i.e., excluding SB1) that each include at least one run-time bad block RTBB a victim super block candidate group. For example, the controller 130 may select one or more super memory blocks, of which the memory blocks in the same plane as the plane PLANE21 to which the run-time bad block BLK121 belongs are normal blocks, among the super memory blocks of the victim super block candidate group. The controller 130 may designate an arbitrary super memory block among the above-selected super memory blocks as the victim super memory block.

For example, the controller 130 may designate the second super memory block SB2 and the third super memory block SB3, each of which includes at least one run-time bad block RTBB as the victim super block candidate group. The run-time bad block BLK121 in the first super memory block SB1 may belong to the second plane PLANE21. The memory blocks BLK221 and BLK321 in the second plane PLANE21 in the second and third super memory blocks SB2 and SB3 respectively may be normal blocks. Therefore, the controller 130 may arbitrary select the second super memory blocks SB2 and SB3, and then designate the second super memory block SB2 as a victim super memory block.

The controller 130 may perform a re-mapping operation of mapping the address of the run-time bad block BLK121 in the first super memory block SB1 to an address of a normal block in the same plane as the plane to which the run-time bad block BLK121 belongs in the detected victim super memory block. For example, the controller 130 may perform a re-mapping operation of mapping the address of the run-time bad block BLK121 in the first super memory block SB1 to an address of normal block BLK221 in the second plane PLANE21 of the second super memory block SB2 which is designated as a victim super memory block.

When the first super memory block SB1 includes only normal memory blocks as a result of the re-mapping operation, the controller 130 may perform a re-mapping operation of replacing a run-time bad block RTBB in the second super memory block SB2 with a normal block in the same manner. For example, the controller 130 may perform a re-mapping operation of mapping the addresses of the normal block BLK321 in the second plane PLANE21 of the first die DIE1 and the normal block BLK312 in the first plane PLANE12 of the second die DIE2 among the memory blocks in the third super memory block SB3 to the addresses of the run-time bad block BLK121 in the second plane PLANE21 of the first die DIE1 and the run-time bad block BLK212 in the first plane PLANE12 of the second die DIE2 among the memory blocks in the second super memory block SB2. According to the re-mapping operation, all the memory blocks in the second super memory block SB2 may become normal blocks as a result of the re-mapping operation, and the controller 130 may store the addresses that are changed as a result of the re-mapping operation in the form of a table, which is described below with reference to FIG. 4.

Figure 4:
FIG. 4 is a diagram illustrating a table storing address information updated as a result of a re-mapping operation.
Figure 4:
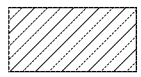

FIG. 4 illustrates a table 402 storing address information updated as a result of a re-mapping operation.

Referring to FIG. 4, the table 402 may correspond to the first to fourth super memory blocks SB1 to SB4 described above. The table 402 may represent information about the changed address obtained as a result of the re-mapping operation.

The controller 130 of FIG. 1 may perform a re-mapping operation of mapping the address of the run-time bad block BLK121 in the first super memory block SB1 to an address of a normal block BLK221 in the second plane PLANE21 of the first die DIE1 to which the run-time bad block BLK121 belongs among the memory blocks in the second super memory block SB2, and then store the changed address obtained as a result of the re-mapping operation in the table 402. For example, the controller 130 may initialize the table 402 by storing the addresses of the memory blocks in the first super memory block SB1 in the fields of a first row of the table 402, and storing the address of the run-time bad block BLK121 in the second plane PLANE21 of the first die DIE1 in the element located at the first row and a second column of the table 402. After performing the re-mapping operation, the controller 130 may update the element located at the first row and the second column of the table 402 with the address of the normal block BLK221 in the second plane PLANE21 of the first die DIE1 to which the run-time bad block BLK121 belongs among the memory blocks in the second super memory block SB2.

Similarly, the controller 130 may perform a re-mapping operation of mapping the addresses of the run-time bad blocks BLK121 and BLK212 in the second super memory block SB2 to the addresses of the normal blocks BLK321 and BLK312 in the third super memory block SB3, respectively, and then store the changed address obtained as a result of the re-mapping operation in the table 402. For example, the controller 130 may update the element located at the second row and the second column and the element located at the second row and a third column with the addresses of the normal blocks BLK321 and BLK312 in the third super memory block SB3, respectively. As described above, the controller 130 may obtain a wider memory space by performing a re-mapping operation between the super memory blocks. However, the re-mapping operation may cause a concern in that the erase/write cycle of each of the super memory blocks may be changed.

Figure 5:
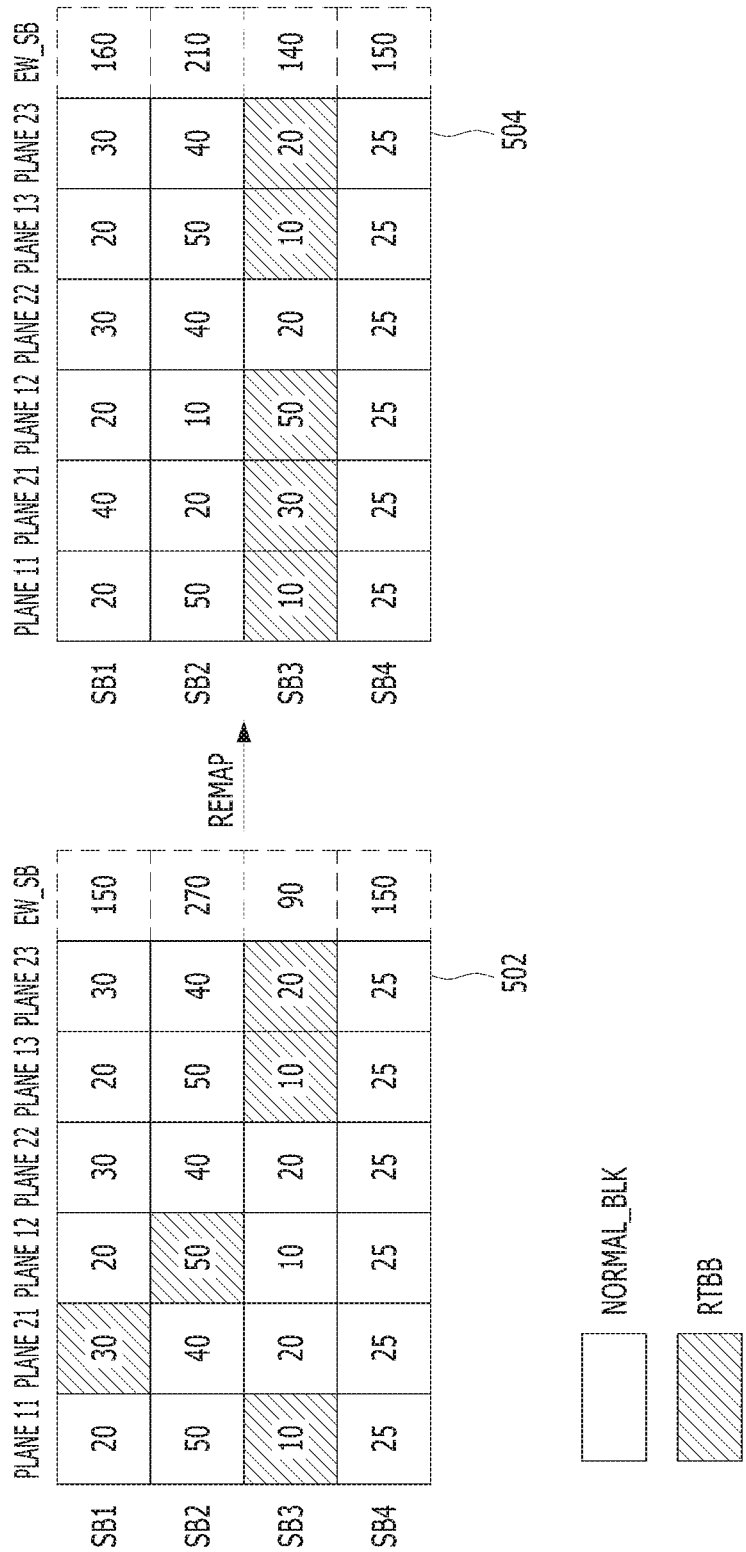
FIG. 5 is an explanatory diagram illustrating an erase/write cycle changing as a result of a re-mapping operation.

FIG. 5 illustrates that an erase/write cycle is changed as a result of a re-mapping operation.

Referring to FIG. 5, a first table 502 and a second table 504 may correspond to the first to fourth super memory blocks SB1 to SB4, previously described. The first table 502 may represent the erase/write cycle of each of the memory blocks before the re-mapping operation is performed, and the second table 504 may represent the erase/write cycle of each of the memory blocks after the re-mapping operation.

The controller 130 may determine the abrasion state of the super memory block based on the erase/write cycle EW_SB of the super memory block, which is the sum of the erase/write cycles of the memory blocks in the super memory block. For example, when the erase/write cycle EW_SB of the super memory block is greater than or equal to a threshold value, which may be predetermined, the controller 130 may select all the memory blocks in the super memory block as wear-leveling target blocks. The erase/write cycle EW_SB of the super memory block may be an important criterion for determining whether to perform the above-described operation such as the wear-leveling operation or the like. When the controller 130 performs a re-mapping operation of swapping the addresses of the memory blocks that belong to different super memory blocks, as described above with reference to FIGS. 3 and 4, the erase/write cycle EW_SB of each of the super memory blocks may be changed, which is problematic.

For example, referring to the first table 502 and the second table 504 shown in FIG. 5, whereas the erase/write cycle EW_SB of the first super memory block SB1 before the re-mapping operation is 150, the erase/write cycle EW_SB of the first super memory block SB1 after the re-mapping operation may be 160. In other words, the erase/write cycle EW_SB of the first super memory block SB1 after the re-mapping operation may be increased by 10. Likewise, the erase/write cycle EW_SB of the second super memory block SB2 may decrease by 60 after the re-mapping operation, and the erase/write cycle EW_SB of the third super memory block SB3 may increase by 50 after the re-mapping operation.

According to an embodiment of the present invention, the controller 130 may form a short super block including a run-time bad block RTBB. In this way, the concern that the erase/write cycle of each of the super memory blocks is changed may be prevented from occurring as well as ensuring a larger memory space even when a run-time bad block RTBB occurs.

Figure 6:
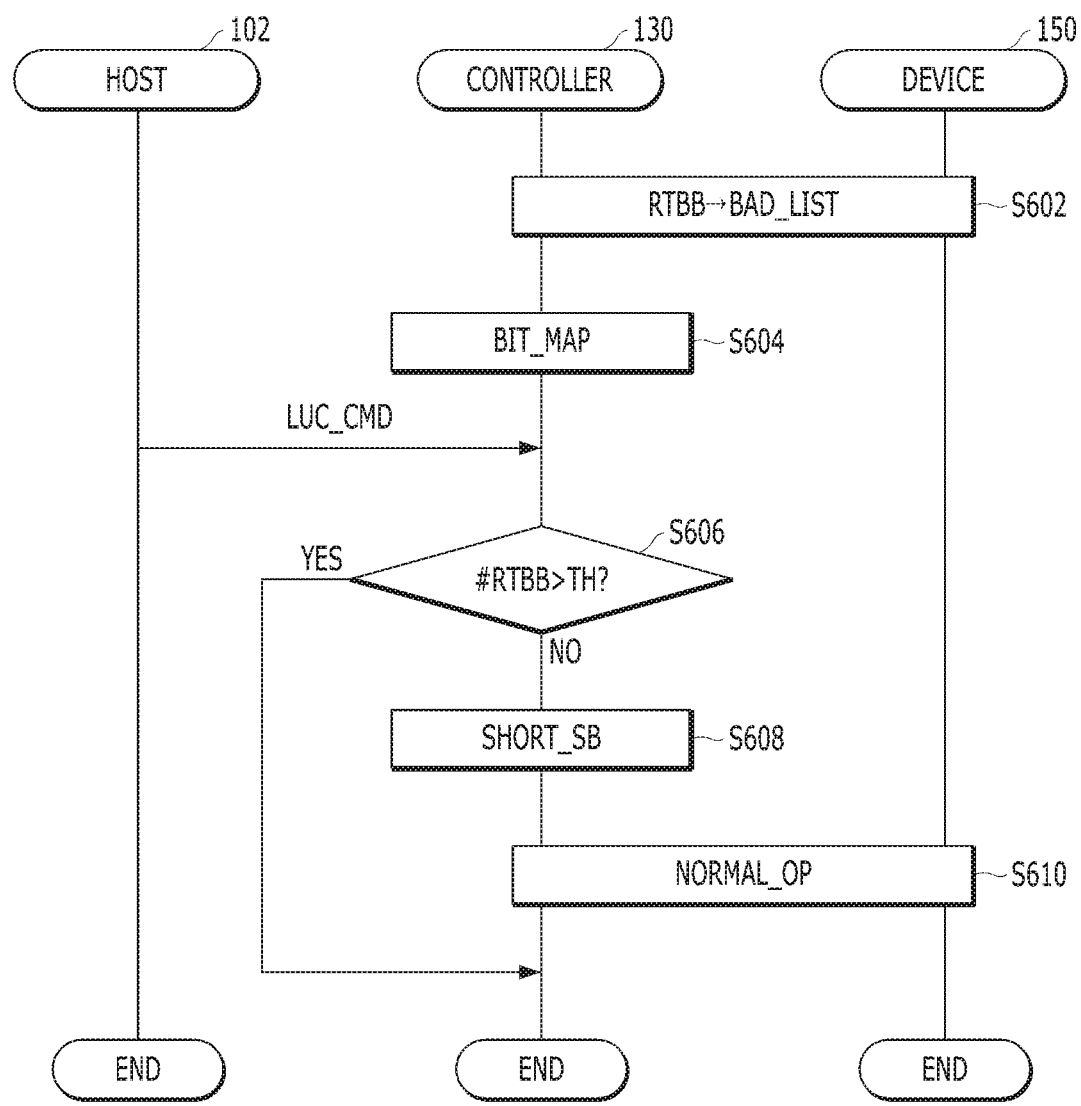
FIG. 6 is a flowchart illustrating an operation of a memory system in accordance with an embodiment of the present invention.

FIG. 6 is a flowchart illustrating an operation of the memory system 110 in accordance with an embodiment of the present invention.

Referring to FIG. 6, in step S602, the controller 130 may include a super memory block including a run-time bad block RTBB in a bad list BAD_LIST whenever the run-time bad block RTBB occurs. The controller 130 may control the memory device 150 not to access the memory blocks forming a super memory block in the bad list BAD_LIST, which is described later with reference to FIG. 7.

In step S604, the controller 130 may generate a bit-map BIT_MAP representing integrity information of the memory blocks in a super memory block. The controller 130 may display or otherwise indicate memory blocks which are normal blocks and memory blocks which are run-time bad blocks RTBB in the bit map BIT_MAP to distinguish normal blocks from RTBBs. For example, as will be described later with reference to FIG. 8, the controller 130 may designate an element corresponding to a normal block as a value of '1' and designate an element corresponding to a run-time bad block RTBB as a value of '0' in the bit-map BIT_MAP.

Figure 7:
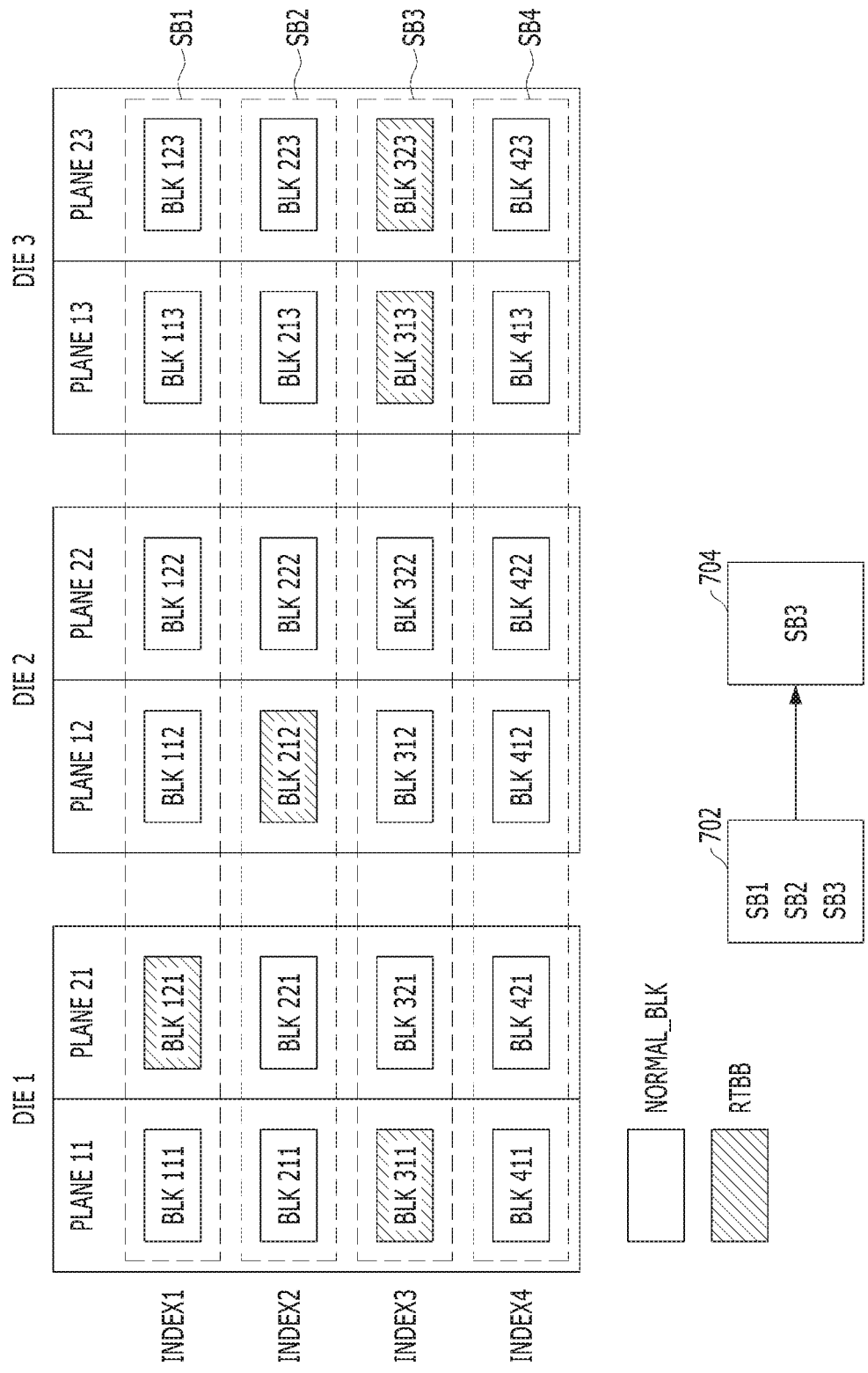
FIG. 7 is a diagram illustrating a process of generating a bad list BAD_LIST in accordance with an embodiment of the present invention.

FIG. 7 illustrates a process of generating the bad list BAD_LIST in accordance with an embodiment of the present invention.

By way of example, FIG. 7 shows a case where a super memory block is formed in the same manner as in FIG. 3, which is described earlier. FIG. 7 shows a case where a memory block in which a run-time bad block RTBB occurs is the same as in FIG. 3.

The controller 130 may detect a memory block BLK121 in the second plane PLANE21 of the first die DIE1 among the memory blocks in the first super memory block SB1 as a run-time bad block RTBB. The controller 130 may include the first super memory block SB1 including the run-time bad block BLK 121 in the first bad list 702. Similarly, the controller 130 may include the second and third super memory blocks SB2 and SB3, each of which include one or more run-time bad blocks RTBB, in the first bad list 702. As will be described later, the controller 130 may delete the super memory blocks designated as short super memory blocks SHORT_SB among the super memory blocks in the first bad list 702 from the first bad list 702, and a super memory block that is not designated as the short super memory block SHORT_SB may remain in the second bad list 704.

FIG. 8 illustrates a process of generating a bit-map in accordance with an embodiment of the present invention.

By way of example, the bit-map 802 corresponding to the super memory blocks described above with reference to FIG. 7 is further described.

The controller 130 may generate a bit-map 802 representing the integrity of the memory blocks in the first to fourth super memory blocks SB1 to SB4. The bit-map 802 may include as many rows as the sum of the number of the first to fourth super memory blocks SB1 to SB4. Also, the bit-map 802 may include as many columns as the number of the memory blocks forming each of the first to fourth super memory blocks SB1 to SB4. For example, the bit-map 802 may include four rows, one for each of the first to fourth super memory blocks SB1 to SB4, and include six columns corresponding to the number of the memory blocks forming each of the first to fourth super memory blocks SB1 To SB4.

According to an embodiment of the present invention, for each of the normal memory blocks in each of the first to fourth super memory blocks SB1 to SB4, the controller 130 may store a value of '1' in an element corresponding to that memory block in the bit-map 802. Also, for each memory block in each of the first to fourth super memory blocks SB1 to SB4 that is a run-time bad block RTBB, the controller 130 may store a value of '0' in an element corresponding to that memory block in the bit-map 802.

Since the second memory block BLK121 in the first super memory block SB1 is a run-time bad block RTBB, the controller 130 may store a value of '0' in an element located at the first row corresponding to the first super memory block SB1 to which the second memory block BLK121 belongs and the second column corresponding to the second plane PLANE21 of the first die DIE1 to which the second memory block BLK121 belongs in the bit-map 802. Also, since the second memory block BLK221 in the second super memory block SB2 is a normal block, the controller 130 may store a value of '1' in an element located at the second row corresponding to the second super memory block SB2 to which the second memory block BLK221 belongs and the second column corresponding to the second plane PLANE21 of the first die DIE1 to which the second memory block BLK221 belongs in the bit-map 802.

Referring back to FIG. 6, in step S606, the controller 130 may compare the number of run-time bad blocks # RTBB in each of the super memory blocks in the bad list BAD_LIST with a threshold value TH in response to a logical unit configuration command LUC_CMD provided from the host 102. The threshold value TH may be predetermined. The controller 130 may update logical unit information including various setting values for a logical address based on the host 102 whenever the logical unit configuration command LUC_CMD is provided from the host 102. According to an embodiment of the present invention, when the number of the run-time bad blocks # RTBB in a super memory block in the bad list BAD_LIST is greater than the threshold value TH ('YES' in the step S606), the controller 130 may have the super memory block remain in the bad list BAD_LIST.

In step S608, when the number of the run-time bad blocks # RTBB in the super memory block in the bad list BAD_LIST is less than or equal to the threshold TH ('NO' in the step S606), the controller 130 may designate the super memory block as a short super block SHORT_SB. The controller 130 may update the bit-map BIT_MAP generated in the step S604 after forming the short super block SHORT_SB with the memory blocks in the super memory block, and delete the super memory block from the bad list BAD_LIST.

Referring back to FIG. 7, the controller 130 may compare the number of the run-time bad blocks # RTBB in each of the first to third super memory blocks SB1 to SB3 in the first bad list 702 with the threshold TH. The controller 130 may designate the super memory blocks in which the # RTBB in each of the first to third super memory blocks SB1 to SB3 is less than or equal to the threshold TH as short super blocks SHORT_SB.

When the threshold value TH is 2, the controller 130 may designate the first and second super memory blocks SB1 and SB2, among the first to third super memory blocks SB1 to SB3, as short super blocks SHORT_SB, because each of SB1 and SB2 has less than 2 RTBBs. The controller 130 may delete the first and second super memory blocks SB1 and SB2 that are designated as the short super blocks SHORT_SB from the first bad list 702. The number of the run-time bad blocks BLK311, BLK313, and BLK323 in the third super memory block SB3 is 3, which is greater than the threshold value TH of 2 in this example. Thus, the controller 130 may have the third super memory block SB3 may remain in the first bad list 702. Since the second bad list 704 shown in FIG. 7 represents the state after the controller 130 has deleted the first and second super memory blocks SB1 and SB2 from the first bad list 702, the second bad list 704 may include the third super memory block SB3.

Referring back to FIG. 6, in step S610, the controller 130 may control the memory device 150 to simultaneously access the normal memory blocks among the memory blocks in the short super block SHORT_SB based on the bit-map 802, previously described. The memory device 150 may perform a normal operation NORMAL_OP on the basis of a unit of a short super block under the control of the controller 130. The memory device 150 may simultaneously perform a program operation or an erase operation on the normal blocks in the short super block SHORT_SB to perform a normal operation NORMAL_OP on the basis of the unit of a short super block so as to improve the performance of the program operation or the erase operation.

When a plurality of program commands and program data are provided from the host 102, the controller 130 may detect the number of normal blocks in the short super block SHORT_SB in the bit-map 802. The controller 130 may calculate the size of data that may be simultaneously programmed into the normal blocks in the short super block SHORT_SB based on the detected number of the normal blocks in the short super block SHORT_SB. The controller 130 may supply the program data corresponding to the calculated data size and the program command corresponding to the program data to the memory device 150 and control the memory device 150 to simultaneously program the program data in the normal blocks in the short super block SHORT_SB.

According to an embodiment of the present invention, when a run-time bad block RTBB occurs as a result of repeatedly performing a program operation or an erase operation, the controller 130 may form a short super block SHORT_SB with memory blocks in a super memory block including the run-time bad block RTBB without performing a re-mapping operation of swapping the addresses of the memory blocks that are included in different super memory blocks. The controller 130 may generate a bit-map representing whether the memory blocks in the short super block SHORT_SB are normal blocks or run-time bad blocks RTBB. The controller 130 may ensure larger memory space while maintaining the erase/write cycle of each of the super memory blocks by controlling the memory device 150 to access only the memory blocks which are normal blocks among the memory blocks in the short super block SHORT_SB and perform a normal operation NORMAL_OP based on the generated bit-map.

Figure 9:
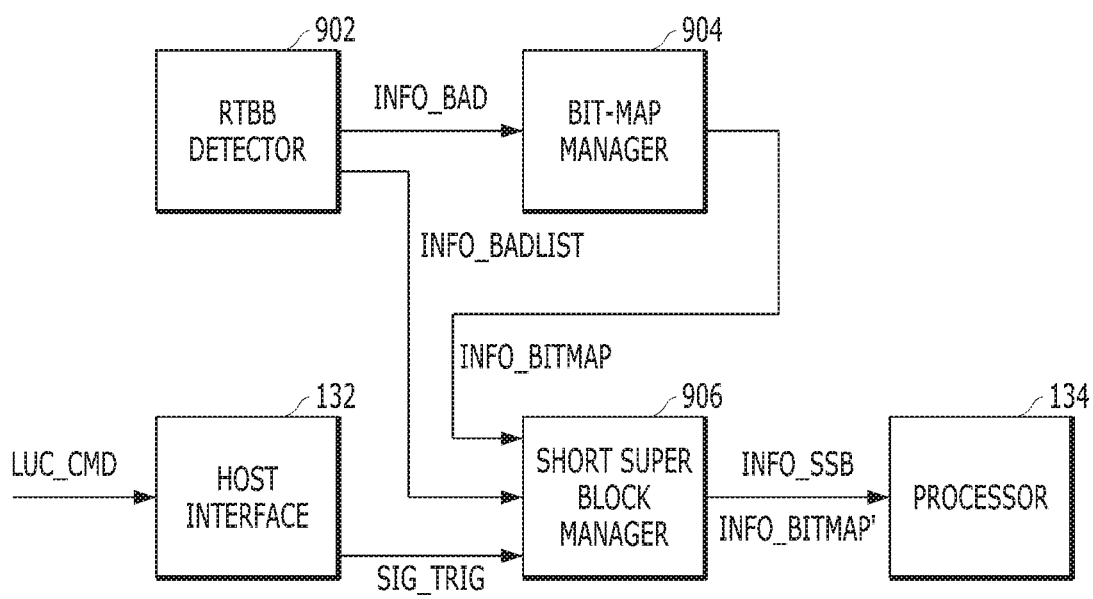
FIG. 9 is a block diagram illustrating a memory system in accordance with an embodiment of the present invention.

FIG. 9 is a block diagram illustrating the memory system 110 in accordance with an embodiment of the present invention. By way of example, FIG. 9 schematically shows only those constituent elements of FIG. 1 related to the description below. Some elements are omitted for clarity.

Referring to FIG. 9, the controller 130 may further include a run-time bad block (RTBB) detector 902, a bit-map manager 904, and a short super block manager 906.

The RTBB detector 902 may detect a run-time bad block RTBB. The run-time bad block RTBB may be an abnormal memory block which is generated as the memory device 150 repeatedly performs a program operation or an erase operation. The RTBB detector 902 may search for the super memory block including the run-time bad block RTBB whenever the run-time bad block RTBB is detected. The RTBB detector 902 may provide information about the run-time bad block INFO_BAD and information about the bad list INFO_BADLIST to the bit-map manager 904 and the short super block manager 906, after searching for the super memory block in the bad list BAD_LIST.

The bit-map manager 904 may generate a bit-map based on the provided run-time bad block information INFO_BAD. The bit-map may represent the integrity of the memory blocks in a super memory block. According to an embodiment of the present invention, as described earlier with reference to FIG. 8, the bit-map manager 904 may display or otherwise indicate the normal blocks and the run-time bad blocks RTBB in a way to distinguish them by storing a value of '1' in an element corresponding to a normal block and storing a value of '0' in an element corresponding to a run-time bad block RTBB among the elements forming the bit-map 802. The bit-map manager 904 may provide information INFO_BITMAP about the generated bit-map to the short super block manager 906.

The host interface 132 may receive the logical unit configuration command LUC_CMD provided from the host 102 and update the logical unit information including diverse setting values for the logical address based on the host 102. The host interface 132 may provide a trigger signal SIG_TRIG to the short superblock manager 906 in response to the provided logical unit configuration command LUC_CMD. According to an embodiment of the present invention, the host interface 132 may provide the trigger signal SIG_TRIG to the short superblock manager 906 whenever it receives the logical unit configuration command LUC_CMD from the host 102, and the short super block manager 906 may form a short super block in response to the provided trigger signal SIG_TRIG as described later.

The short super block manager 906 may designate a short super block in response to the provided trigger signal SIG_TRIG. When the number of the run-time bad blocks # RTBB in a super memory block in the bad list BAD_LIST is less than or equal to a threshold value TH based on the provided bad block list information INFO_BADLIST, the short superblock manager 906 may designate the super memory block as a short super block SHORT_SB. The short super block manager 906 may update the provided bit-map information INFO_BITMAP after forming the short super block SHORT_SB with the memory blocks in the super memory block, and delete the super memory block from the bad list BAD_LIST. When the number of the run-time bad blocks # RTBB in the super memory block in the bad list BAD_LIST is greater than the threshold value TH, the short super block manager 906 may have the super memory block remain in the bad list BAD_LIST. The short super block manager 906 may provide the updated bit-map information INFO_BITMAP' and the information about the short super block INFO_SSB to the processor 134.

The processor 134 may control the memory device 150 to access only the normal memory blocks among the memory blocks in the short super block SHORT_SB based on the provided bit-map information INFO_BITMAP'. The memory device 150 may perform a normal operation NORMAL_OP on the basis of a unit of a short super block under the control of the processor 134. The memory device 150 may improve the performance of a program operation or an erase operation by simultaneously performing a program operation or an erase operation on the normal blocks included in the short super block SHORT_SB.

Additional features of the memory device 150 in the memory system 100 in accordance with embodiments of the present invention are described in more detail below with reference to FIGS. 10 to 12.

Figure 10:
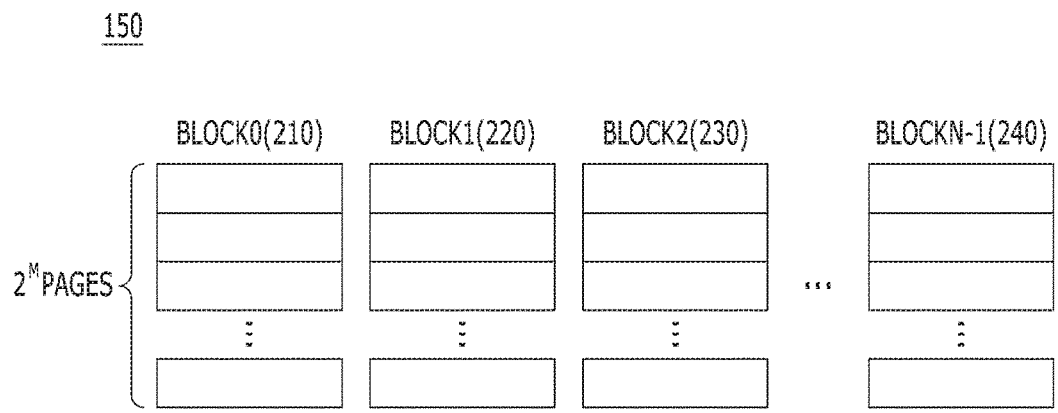
FIG. 10 is a schematic diagram illustrating an exemplary configuration of a memory device employed in the memory system shown in FIG. 1.

FIG. 10 is a schematic diagram illustrating the memory device 150. FIG. 11 is a circuit diagram illustrating an exemplary configuration of a memory cell array of a memory block 330 in the memory device 150. FIG. 12 is a schematic diagram illustrating an exemplary three-dimensional (3D) structure of the memory device 150.

Referring to FIG. 10, the memory device 150 may include a plurality of memory blocks BLOCK0 to BLOCKN-1, where N is an integer greater than 1. Each of the blocks BLOCK0 to BLOCKN-1 may include a plurality of pages, for example, $2^M$ or M pages, the number of which may vary according to circuit design, M being an integer greater than 1. Each of the pages may include a plurality of memory cells that are coupled to a plurality of word lines WL.

Each of the memory blocks BLOCK0 to BLOCKN-1 is comprised of memory cells. Each memory cell in a given block may be a single level cell (SLC) storing 1-bit data or a multi-level cell (MLC) storing 2-bit data. Hence, the memory device 150 may include memory blocks including SLCs (i.e., SLC memory blocks) or memory blocks including MLCs (i.e., MLC memory blocks), depending on the number of bits which can be expressed or stored in each of the memory cells in the memory blocks. The SLC memory blocks may include a plurality of pages which are embodied by the SLC memory cells. The SLC memory blocks may generally have higher data computing performance and higher durability than the MLC memory blocks. The MLC memory blocks may include a plurality of pages which are embodied by MLC memory cells. The MLC memory blocks may generally have larger data storage space, that is, higher integration density, than the SLC memory blocks. In another embodiment, the memory device 150 may include a plurality of triple level cell (TLC) memory blocks. The TCL memory blocks may include a plurality of pages which are embodied by memory cells each capable of storing 3-bit data. In yet another embodiment, the memory device 150 may include a plurality of quadruple level cell (QLC) memory blocks. The QLC memory blocks may include a plurality of pages which are embodied by memory cells each capable of storing 4-bit data.

Instead of a nonvolatile memory, the memory device 150 may be implemented by any of a phase change random access memory (PCRAM), a resistive random access memory (RRAM or ReRAM), a ferroelectrics random access memory (FRAM), and a spin transfer torque magnetic random access memory (STT-RAM or STT-MRAM).

The memory blocks 210, 220, 230, 240 may store the data transferred from the host 102 through a program operation, and may transfer data stored therein to the host 102 through a read operation.

Figure 11:
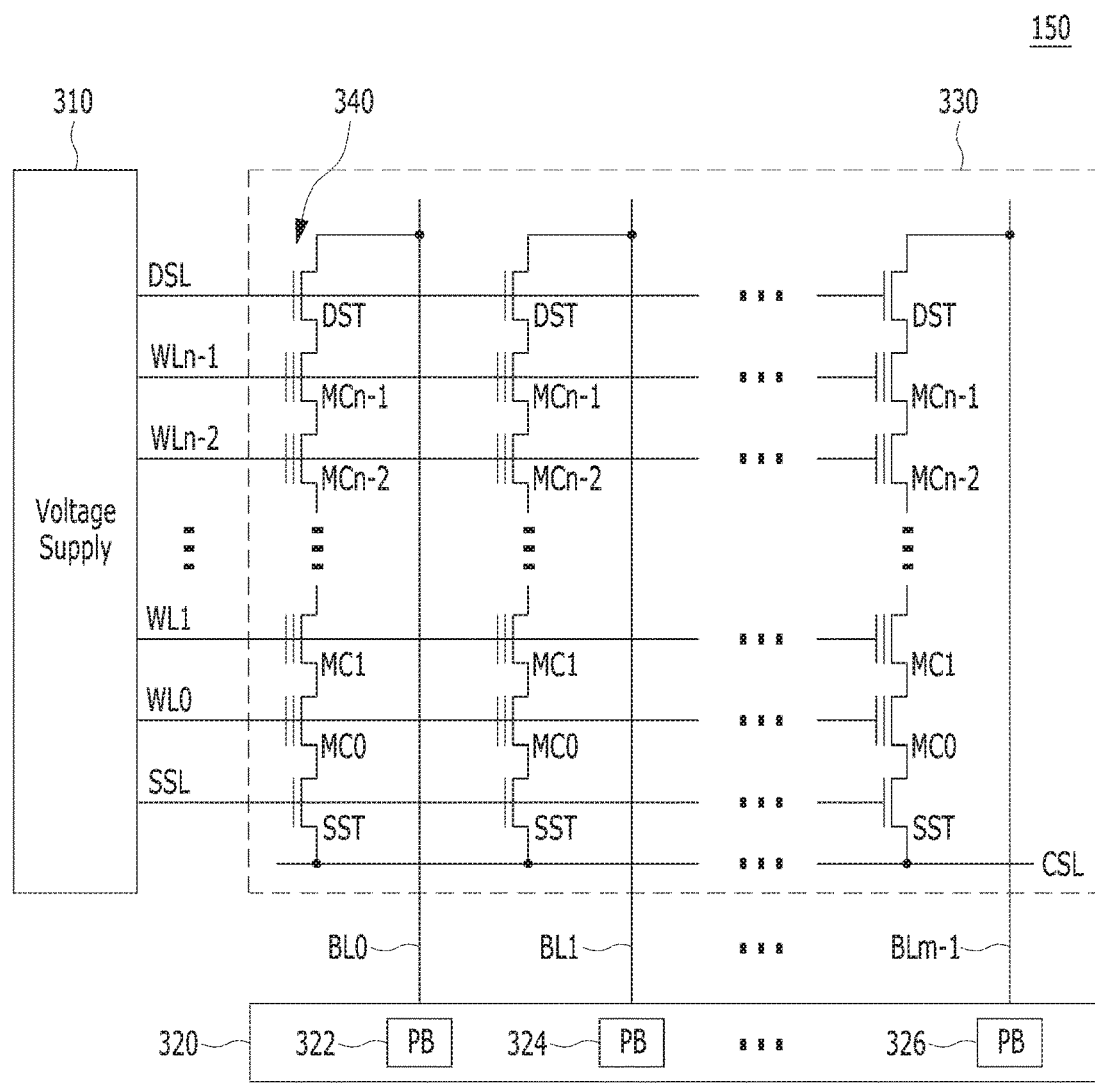
FIG. 11 is a circuit diagram illustrating an exemplary configuration of a memory cell array of a memory block in the memory device shown in FIG. 1.
Figure 12:
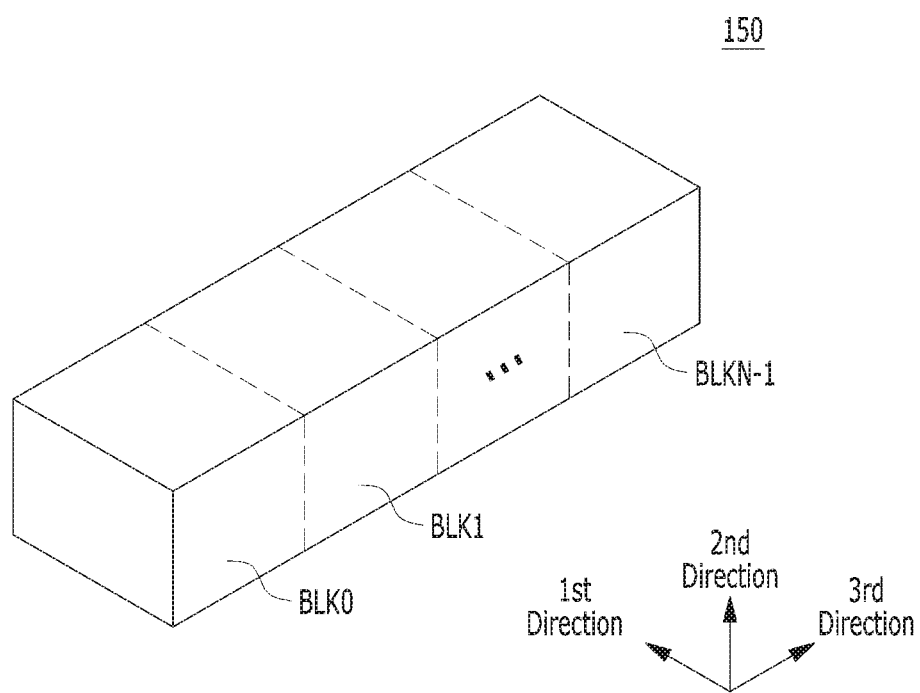
FIG. 12 is a block diagram illustrating a structure of a memory device of a memory system in accordance with an embodiment of the present invention.

Referring to FIG. 11, the representative memory block 330 may include a plurality of cell strings 340 coupled to a plurality of corresponding bit lines BL0 to BLm-1. The cell string 340 of each column may include one or more drain select transistors DST and one or more source select transistors SST. Between the drain and source select transistors DST and SST, a plurality of memory cells MC0 to MCn-1 may be coupled in series. In an embodiment, each of the memory cell transistors MC0 to MCn-1 may be embodied by an MLC capable of storing data information of a plurality of bits. Each of the cell strings 340 may be electrically coupled to a corresponding bit line among the plurality of bit lines BL0 to BLm-1. For example, as illustrated in FIG. 11, the first cell string is coupled to the first bit line BL0, and the last cell string is coupled to the last bit line BLm-1.

Although FIG. 11 illustrates NAND flash memory cells, the present invention is not limited thereto. It is noted that the memory cells may be NOR flash memory cells, or hybrid flash memory cells including two or more kinds of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage, and a pass voltage to supply to the word lines according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

The memory device 150 may be embodied by a two-dimensional (2D) or three-dimensional (3D) memory device. Particularly, as illustrated in FIG. 12, the memory device 150 may be embodied by a nonvolatile memory device having a 3D stack structure. When the memory device 150 has a 3D structure, the memory device 150 may include a plurality of memory blocks BLK0 to BLKN-1. Herein, FIG. 12 is a block diagram illustrating the memory blocks 152, 154 and 156 of the memory device 150 shown in FIG. 1. Each of the memory blocks 152, 154 and 156 may be realized in a 3D structure (or vertical structure). For example, the memory blocks 152, 154 and 156 may each have a 3D structure with dimensions extending in first to third directions, e.g., an x-axis direction, a y-axis direction, and a z-axis direction.

Each memory block 330 in the memory device 150 may include a plurality of NAND strings NS that are extended in the second direction. A plurality of NAND strings NS may extend in the first direction and the third direction. Herein, each of the NAND strings NS may be coupled to a bit line BL, at least one string select line SSL, at least one ground select line GSL, a plurality of word lines WL, at least one dummy word line DWL, and a common source line CSL, and each of the NAND strings NS may include a plurality of transistor structures TS.

In short, each memory block 330 among the memory blocks 152, 154 and 156 of the memory device 150 may be coupled to a plurality of bit lines BL, a plurality of string select lines SSL, a plurality of ground select lines GSL, a plurality of word lines WL, a plurality of dummy word lines DWL, and a plurality of common source lines CSL, and each memory block 330 may include a plurality of NAND strings NS. In each memory block 330, one bit line BL may be coupled to a plurality of NAND strings NS to realize a plurality of transistors in one NAND string NS. A string select transistor SST of each NAND string NS may be coupled to a corresponding bit line BL, and a ground select transistor GST of each NAND string NS may be coupled to a common source line CSL. Herein, memory cells MC may be provided between the string select transistor SST and the ground select transistor GST of each NAND string NS. In other words, a plurality of memory cells may be realized in each memory block 330 of the memory blocks 152, 154 and 156 of the memory device 150.

A data processing system and electronic devices to which the above-described memory system 110 including the memory device 150 and the controller 130 may be applied, in accordance with various embodiments of the present invention, are described in detail below with reference to FIGS. 13 to 21.

Figure 13:
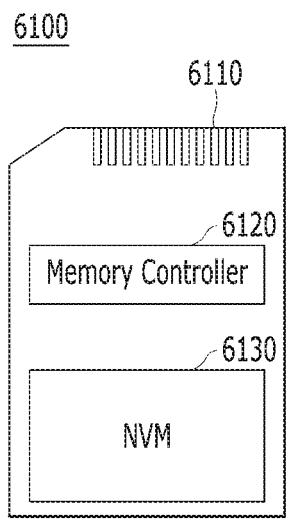
FIGS. 13 to 21 are diagrams schematically illustrating exemplary applications of a data processing system in accordance with various embodiments of the present invention.

FIG. 13 is a diagram schematically illustrating another example of the data processing system including the memory system in accordance with an embodiment. For example, FIG. 13 schematically illustrates a memory card system 6100 to which the memory system may be applied.

Referring to FIG. 13, the memory card system 6100 may include a memory controller 6120, a memory device 6130 and a connector 6110.

More specifically, the memory controller 6120 may be electrically connected to, and configured to access, the memory device 6130 embodied by a nonvolatile memory (NVM). For example, the memory controller 6120 may be configured to control read, write, erase and background operations of the memory device 6130. The memory controller 6120 may be configured to provide an interface between the memory device 6130 and a host, and to use firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface and an error correction component.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), wireless fidelity (Wi-Fi or WiFi) and Bluetooth. Thus, the memory system and the data processing system may be applied to wired/wireless electronic devices including mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device to form a solid-state drive (SSD). Also, the memory controller 6120 and the memory device 6130 may be so integrated to form a memory card such as a PC card (e.g., a personal computer memory card international association (PCMCIA) card), a compact flash (CF) card, a smart media card (e.g., a SM and a SMC), a memory stick, a multimedia card (e.g., a MMC, a RS-MMC, a MMCmicro and an eMMC), a secure digital (SD) card (e.g., a SD, a miniSD, a microSD and a SDHC), and/or a universal flash storage (UFS).

Figure 14:
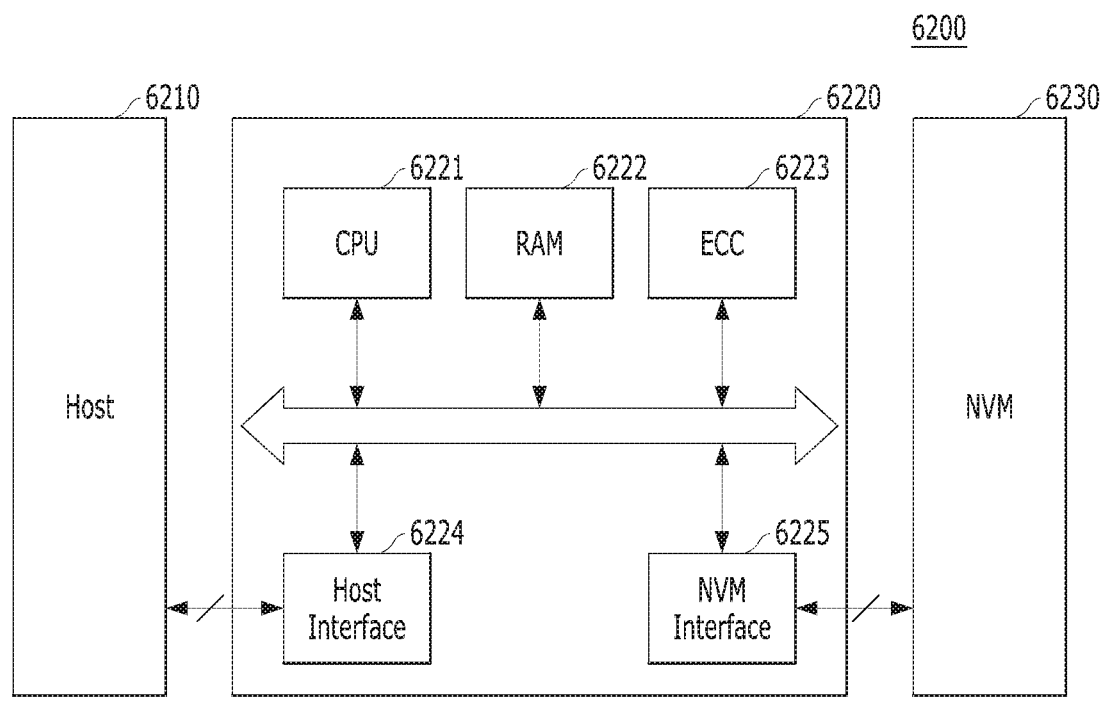

FIG. 14 is a diagram schematically illustrating another example of a data processing system 6200 including the memory system in accordance with an embodiment.

Referring to FIG. 14, the data processing system 6200 may include a memory device 6230 having one or more nonvolatile memories and a memory controller 6220 for controlling the memory device 6230. The data processing system 6200 illustrated in FIG. 14 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224 and a memory interface such as a nonvolatile memory (NVM) interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. The ECC circuit 6223 may correct an error using the low density parity check (LDPC) code, Bose-Chaudhri-Hocquenghem (BCH) code, turbo code, Reed-Solomon (RS) code, convolution code, recursive systematic code (RSC) or coded modulation such as trellis coded modulation (TCM) or block coded modulation (BCM).

The memory controller 6220 may exchange data with the host 6210 through the host interface 6224. The memory controller 6220 may exchange data with the memory device 6230 through the NVM interface 6225. The host interface 6224 may be connected to the host 6210 through a parallel advanced technology attachment (PATA) bus, a serial advanced technology attachment (SATA) bus, a small computer system interface (SCSI), a universal serial bus (USB), a peripheral component interconnect-express (PCIe) or a NAND interface. The memory controller 6220 may have a wireless communication function with a mobile communication protocol such as wireless fidelity (WiFi) or long term evolution (LTE). The memory controller 6220 may be connected to an external device, for example, the host 6210 or another external device, and then transmit/receive data to/from the external device. In particular, as the memory controller 6220 is configured to communicate with the external device according to one or more of various communication protocols, the memory system and the data processing system may be applied to wired/wireless electronic devices, particularly mobile electronic devices.

Figure 15:
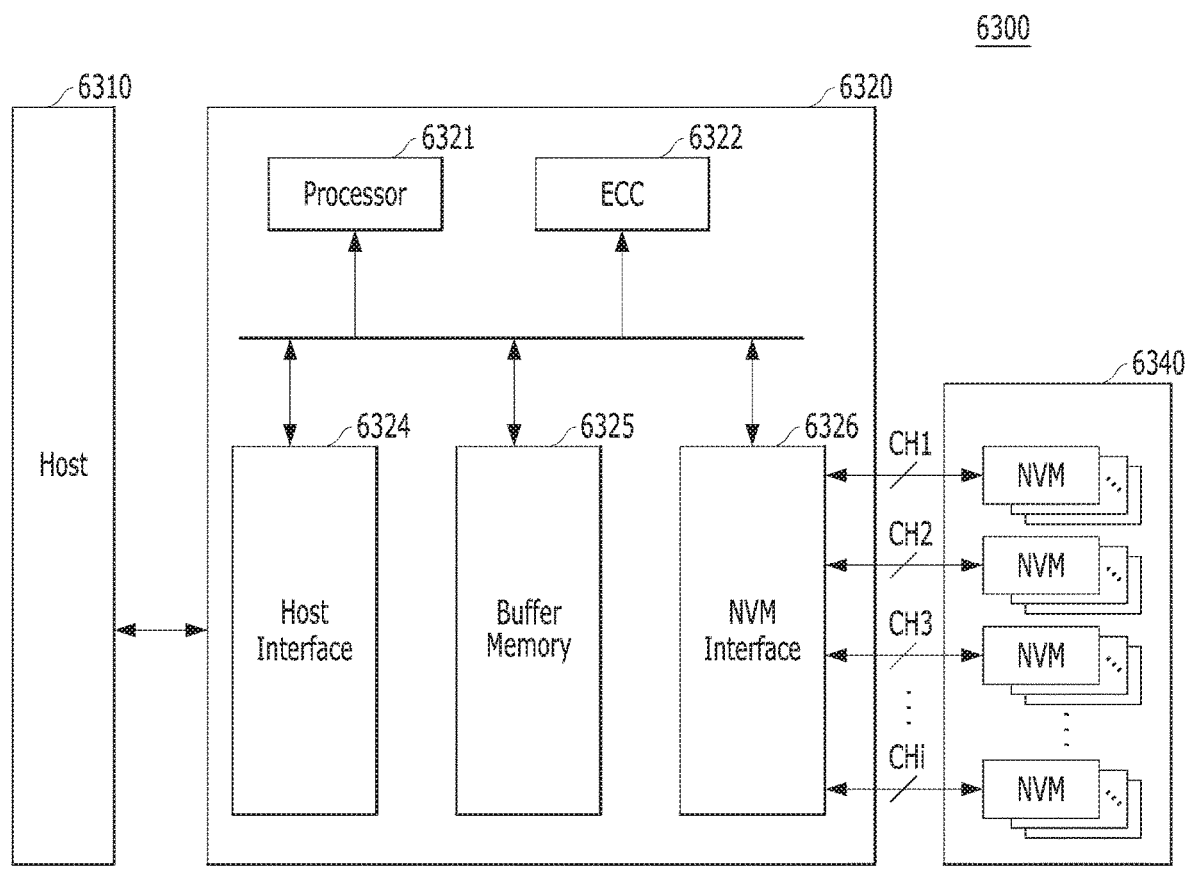

FIG. 15 is a diagram schematically illustrating another example of the data processing system including the memory system in accordance with an embodiment. For example, FIG. 15 schematically illustrates a solid state drive (SSD) 6300 to which the memory system may be applied.

Referring to FIG. 15, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an error correction code (ECC) circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories such as a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). FIG. 15 illustrates that the buffer memory 6325 is embodied in the controller 6320. However, the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 may be applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 16:
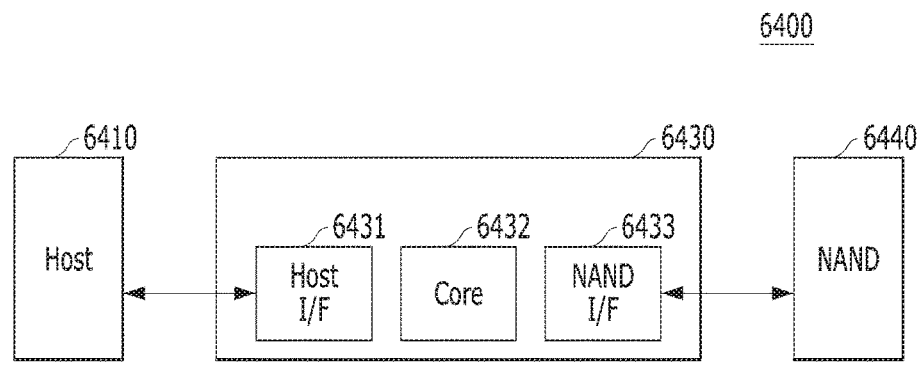

FIG. 16 is a diagram schematically illustrating another example of the data processing system including the memory system in accordance with an embodiment. For example, FIG. 16 schematically illustrates an embedded Multi-Media Card (eMMC) 6400 to which the memory system may be applied.

Referring to FIG. 16, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, ultra high speed (UHS)-I/UHS-II interface.

FIGS. 17 to 20 are diagrams schematically illustrating other examples of the data processing system including the memory system in accordance with embodiments. For example, FIGS. 17 to 20 schematically illustrate universal flash storage (UFS) systems to which the memory system may be applied.

Referring to FIGS. 17 to 20, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices or particularly mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or particularly mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 14 to 16, and the UFS cards 6530, 6630, 6730, 6830 may be embodied in the form of the memory card system 6100 described with reference to FIG. 13.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other through any of various protocols other than the UFS protocol, for example, universal storage bus (USB) Flash Drives (UFDs), a multi-media card (MMC), a secure digital (SD), a mini-SD, and a micro-SD.

Figure 17:
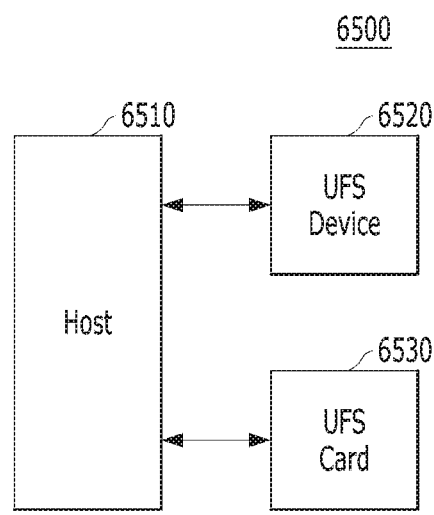

In the UFS system 6500 illustrated in FIG. 17, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation is an arrangement in which a single device is coupled with plural devices for centralized operation. A plurality of UFS cards may be connected in parallel or in the form of a star to the UFS device 6520 or connected in series or in the form of a chain to the UFS device 6520.

Figure 18:
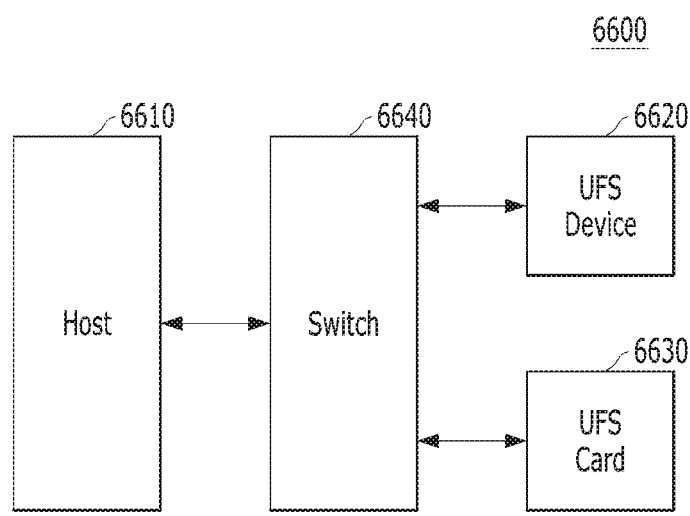

In the UFS system 6600 illustrated in FIG. 18, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 19:
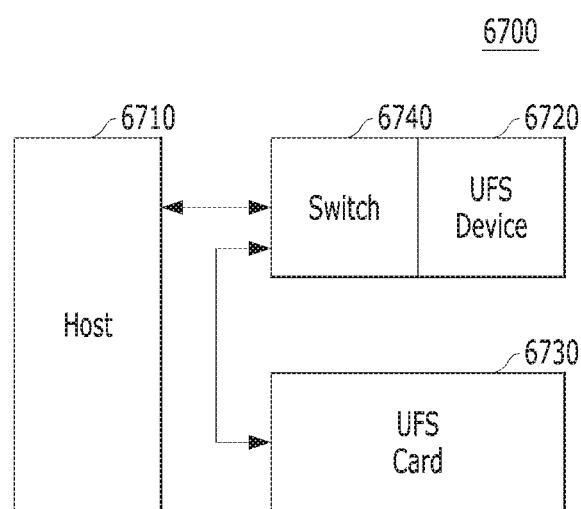

In the UFS system 6700 illustrated in FIG. 19, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the illustrated embodiment, one UFS device 6720 and one UFS card 6730 are connected to the switching module 6740. However, a plurality of modules, each including the switching module 6740 and the UFS device 6720, may be connected in parallel or in the form of a star to the host 6710. In another example, a plurality of modules may be connected in series or in the form of a chain to each other. Furthermore, a plurality of UFS cards may be connected in parallel or in the form of a star to the UFS device 6720.

Figure 20:
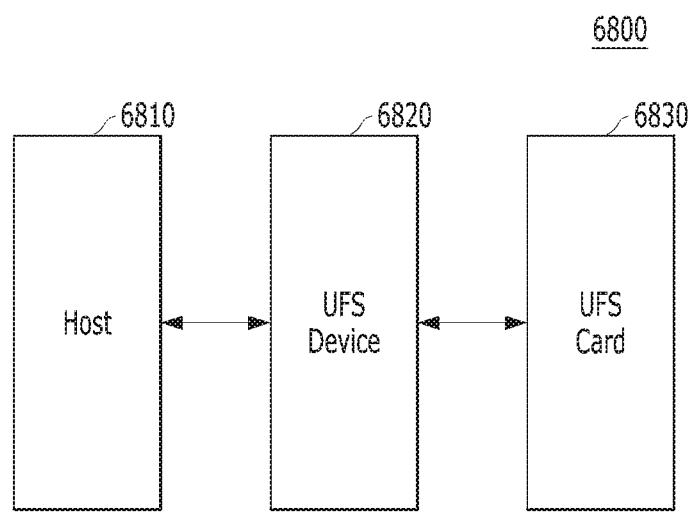

In the UFS system 6800 illustrated in FIG. 20, each of the host 6810, the UFS device 6820 and the UFS card 6830 may include M-PHY and UniPro. The UFS device 6820 may perform a switching operation to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820. In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 21:
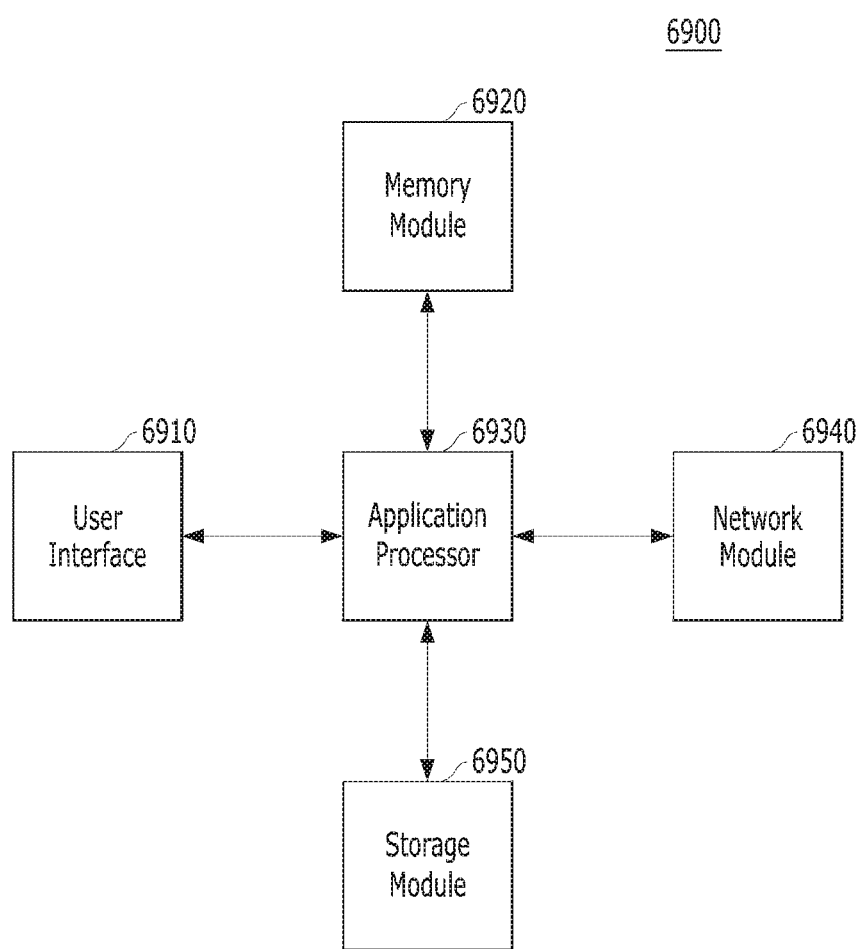

FIG. 21 is a diagram schematically illustrating another example of the data processing system including the memory system in accordance with an embodiment of the present invention. For example, FIG. 21 is a diagram schematically illustrating a user system 6900 to which the memory system may be applied.

Referring to FIG. 21, the user system 6900 may include an application processor 6930, a memory module 6920, a network module 6940, a storage module 6950 and a user interface 6910.

More specifically, the application processor 6930 may drive components in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile random access memory (RAM) such as a dynamic RAM (DRAM), a synchronous DRAM (SDRAM), a double data rate (DDR) SDRAM, a DDR2 SDRAM, a DDR3 SDRAM, a low power DDR (LPDDR) SDARM, a LPDDR3 SDRAM or a LPDDR4 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on package on package (PoP).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 15 to 20.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, a memory system may maintain an erase/write cycle of each of a plurality of super blocks as well as securing a large memory space by forming a short super block including a run-time bad block.

While the present invention has been illustrated and described with respect to the specific embodiments, it will be apparent to those skilled in the art in light of the present disclosure that various changes and modifications may be made without departing from the spirit and scope of the invention as defined in the following claims.

What is claimed is:

1. A memory system, comprising:
   a memory device;
   a run-time bad block detector suitable for storing information of super memory blocks, each including a run-time bad block, in a bad list;
   a bit-map manager suitable for generating a bit-map representing integrity information of memory blocks in each of the super memory blocks;
   a short super block manager suitable for designating, among the super memory blocks, a super memory block having a number of run-time bad blocks less than or equal to a threshold as a short super memory block based on the bad list and the bit-map, whenever a logical unit configuration command is received from a host; and
   a processor suitable for controlling the memory device to simultaneously access normal blocks among the memory blocks forming the designated short super memory block and to perform a normal operation, based on the bit-map.

2. The memory system of claim 1, further comprising:
   a host interface suitable for receiving the logical unit configuration command from the host.

3. The memory system of claim 1, wherein the run-time bad block is an abnormal memory block which occurs as a result of repeatedly performing a program operation or an erase operation.

4. The memory system of claim 1, wherein the short super block manager updates the bit-map after designating the short super memory block.

5. The memory system of claim 1, wherein, when a first memory block in the short super block is a normal block, the bit-map manager stores a first logic value in an element corresponding to the first memory block in the bit-map.

6. The memory system of claim 1, wherein, when a second memory block in the short super block is a run-time bad block, the bit-map manager stores a second logic value in an element corresponding to the second memory block in the bit-map.

7. The memory system of claim 1, wherein the normal operation includes a program operation or an erase operation.

8. The memory system of claim 1, wherein the short super block manager is configured to retain, among the super memory blocks, a super memory block having a number of run time bad blocks greater than the threshold in the bad list.

9. The memory system of claim 1, wherein the processor calculates an erase/write cycle based on a unit of a super memory block.

10. The memory system of claim 2, wherein the host interface provides a trigger signal to the short super block manager whenever the logical unit configuration command is received.

11. A method for operating a memory system, comprising:
    storing information of super memory blocks, each including a run-time bad block, in a bad list;
    generating a bit-map representing integrity information of memory blocks in each of the super memory blocks;
    designating, among the super memory blocks, a super memory block having a number of run-time bad blocks less than or equal to a threshold as a short super memory block based on the bad list and the bit-map, whenever a logical unit configuration command is received from a host; and simultaneously accessing normal blocks among the memory blocks forming the designated short super memory block and performing a normal operation based on the bit-map.

12. The method of claim 11, further comprising:

receiving the logical unit configuration command from the host.

13. The method of claim 12, wherein the run-time bad block is an abnormal memory block which occurs as a result of repeatedly performing a program operation or an erase operation.

14. The method of claim 11, further comprising:

updating the bit-map after designating the short super memory block.

15. The method of claim 11, wherein the generating of the bit-map includes storing a first logic value in an element corresponding to a first memory block in the bit-map when the first memory block in the short super block is a normal block.

16. The method of claim 11, wherein the generating of the bit-map includes storing a second logic value in an element corresponding to a second memory block in the bit-map when the second memory block in the short super block is a run-time bad block.

17. The method of claim 11, wherein the normal operation includes a program operation or an erase operation.

18. The method of claim 11, wherein the designating of the super memory block includes retaining, among the super memory blocks, a super memory block having a number of run-time bad blocks greater than the threshold in the bad list.

19. The method of claim 11, wherein the simultaneous accessing of the normal blocks among the memory blocks forming the designated short super memory block and the performing of the normal operation based on the bit-map includes calculating an erase/write cycle based on a unit of a super memory block.

20. The method of claim 12, wherein the receiving of the logical unit configuration command from the host includes generating a trigger signal whenever the logical unit configuration command is received.

\* \* \* \* \*